US008771420B2

(12) United States Patent
Na et al.

(10) Patent No.: US 8,771,420 B2
(45) Date of Patent: Jul. 8, 2014

(54) SUBSTRATE PROCESSING APPARATUS

(75) Inventors: Heung-Yeol Na, Yongin (KR); Ki-Yong Lee, Yongin (KR); Jin-Wook Seo, Yongin (KR); Min-Jae Jeong, Yongin (KR); Jong-Won Hong, Yongin (KR); Eu-Gene Kang, Yongin (KR); Seok-Rak Chang, Yongin (KR); Yun-Mo Chung, Yongin (KR); Tae-Hoon Yang, Yongin (KR); Byung-Soo So, Yongin (KR); Byoung-Keon Park, Yongin (KR); Dong-Hyun Lee, Yongin (KR); Kil-Won Lee, Yongin (KR); Jong-Ryuk Park, Yongin (KR); Bo-Kyung Choi, Yongin (KR); Ivan Maidanchuk, Yongin (KR); Won-Bong Baek, Yongin (KR); Jae-Wan Jung, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 905 days.

(21) Appl. No.: 12/714,019

(22) Filed: Feb. 26, 2010

(65) Prior Publication Data

US 2010/0263594 A1 Oct. 21, 2010

(30) Foreign Application Priority Data

Apr. 16, 2009 (KR) .................. 10-2009-0033235

(51) Int. Cl.
| | |
|---|---|
| C23C 16/46 | (2006.01) |
| H01L 21/306 | (2006.01) |
| C23F 1/00 | (2006.01) |
| C23C 16/06 | (2006.01) |
| C23C 16/22 | (2006.01) |

(52) U.S. Cl.
USPC ...... 118/725; 118/724; 118/728; 156/345.37; 156/345.51; 156/345.52; 156/345.54

(58) Field of Classification Search
USPC ............... 118/724, 725, 728; 156/345.37, 156/345.51–345.52, 345.54
See application file for complete search history.

(56) References Cited

U.S. PATENT DOCUMENTS

| | | | | |
|---|---|---|---|---|
| 4,062,318 | A | * | 12/1977 | Ban et al. ............ 118/725 |
| 5,951,282 | A | | 9/1999 | Sakata et al. |
| 6,444,940 | B1 | * | 9/2002 | Saito et al. .......... 219/390 |
| 6,727,474 | B2 | * | 4/2004 | Gat .................... 219/390 |
| 2003/0183614 | A1 | * | 10/2003 | Yamaguchi et al. ... 219/390 |
| 2010/0068893 | A1 | * | 3/2010 | Kato et al. .......... 438/758 |

FOREIGN PATENT DOCUMENTS

| | | |
|---|---|---|
| JP | 2000-21797 | 1/2000 |
| JP | 2003-100649 | 4/2003 |
| JP | 2006-338676 | 12/2006 |
| JP | 2008-244449 | 10/2008 |
| KR | 10-2001-0060139 | 7/2001 |
| KR | 10-0461292 | 2/2005 |
| KR | 10-2006-0007416 | 1/2006 |
| KR | 10-2007-0070333 | 7/2007 |

* cited by examiner

*Primary Examiner* — Rudy Zervigon
(74) *Attorney, Agent, or Firm* — H.C. Park & Associates, PLC

(57) ABSTRACT

A substrate processing apparatus that forms thin films on a plurality of substrates and thermally processes the substrates, by uniformly heating the substrates. The substrate processing apparatus includes a processing chamber, a boat in which substrates are stacked, an external heater located outside of the processing chamber, a feeder to move the boat into and out of the processing chamber, a lower heater located below the feeder, and a central heater located in the center of the boat.

18 Claims, 1 Drawing Sheet

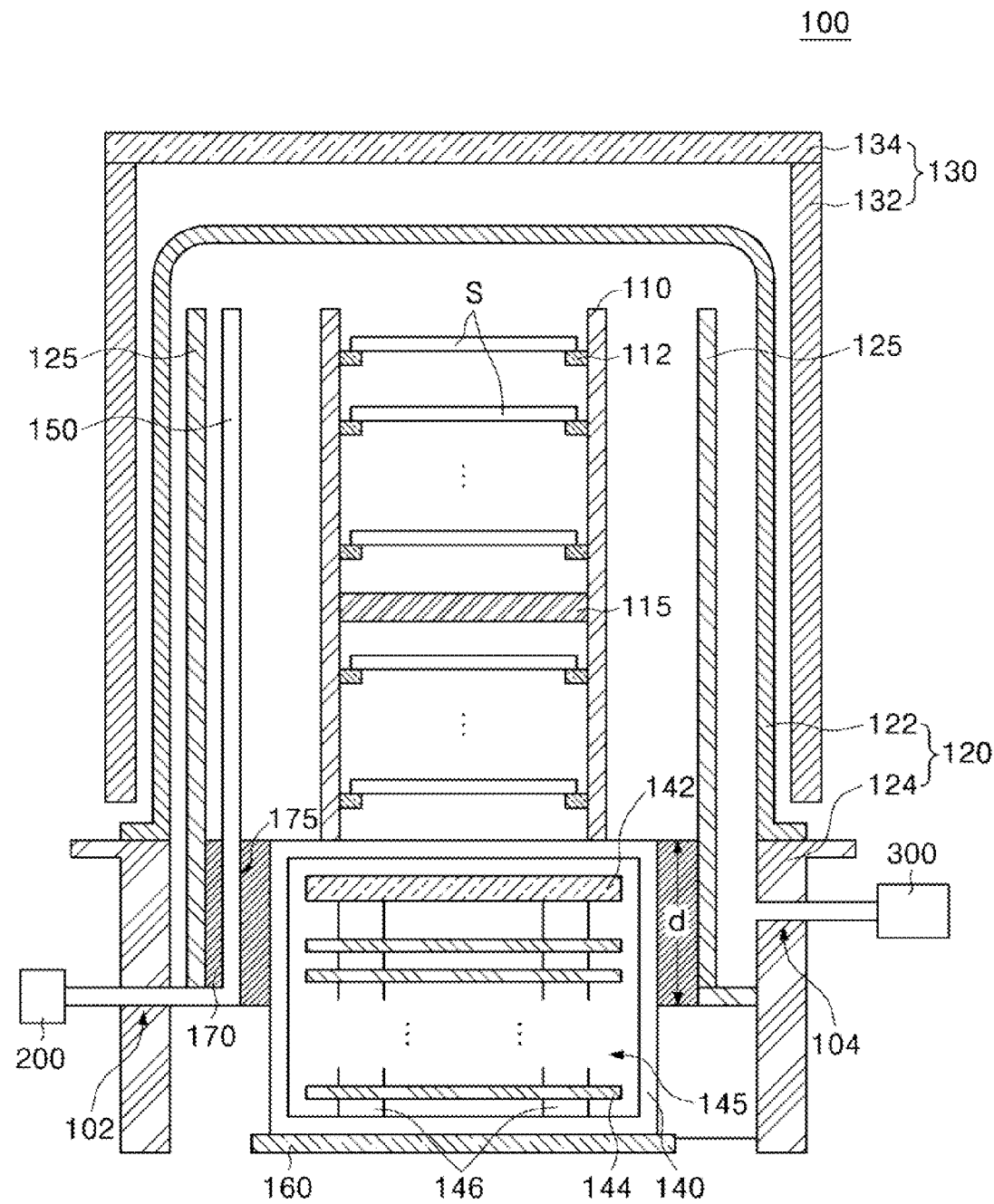

SUBSTRATE PROCESSING APPARATUS

CROSS-REFERENCE TO RELATED APPLICATION

This application claims the benefit of Korean Patent Application No. 10-009-0033235, filed on Apr. 16, 2009, in the Korean Intellectual Property Office, the disclosure of which is incorporated herein, by reference.

BACKGROUND

1. Field

An aspect of the present teachings relate to a substrate processing apparatus to thermally process substrates and/or form thin films on the substrates.

2. Description of the Related Art

Flat panel display devices are replacing cathode-ray tube display devices, due to their lighter weight and thinner profile. Flat panel display devices include liquid crystal display (LCD) devices and organic light emitting diode (OLED) display devices. Organic light emitting diode display devices provide improved brightness and viewing angles, as compared to liquid crystal display devices, and do not require backlight units, thereby realizing ultra-thin thicknesses.

In order to produce light, organic light emitting diode display devices use energy emitted from excitons, which are formed in an organic thin film when electrons injected from a cathode and holes injected from an anode are combined. Organic light emitting diode display devices are classified into passive-matrix OLEDs and active-matrix OLEDs, according to the driving method thereof. Active-matrix OLEDs have circuits that include thin film transistors (TFTs).

A flat panel display device is manufactured by forming a thin film, having electrical characteristics according to a determined pattern, on a substrate, using an organic material or an inorganic material. The thin film is then thermally processed. In this case, a thin film is mainly formed by a physical vapor deposition (PVD) method, such as a sputtering process, in which plasma is applied to a deposition target; or a chemical vapor deposition (CVD) method, such as an atomic layer deposition (ALD) process, in which reaction gases containing a source material are sprayed onto a substrate, to chemically form atomic layers of the source material on the substrate.

The chemical vapor deposition method produces thin films having excellent uniformity and step coverage, as compared to the physical vapor deposition method, and enables the simultaneous processing of a plurality of substrates. Therefore, it is widely used to form an amorphous silicon layer and an insulation layer, such as a nitride layer or an oxide layer.

In general, in order to simultaneously form thin films on a plurality of substrates, or to thermally process the substrates using the chemical vapor deposition method, a substrate processing apparatus includes a processing chamber for processing a plurality of substrates, a boat in which the substrates are stacked, a heater located outside the processing chamber to heat the interior of the processing chamber, and a feeder to move the boat into and out of the processing chamber.

However, since the heater is located outside of the processing chamber, and the processing chamber is generally large, so as to accommodate the boat, it is difficult to uniformly heat the interior of the processing chamber. In particular, substrates in the boat are not uniformly heated.

SUMMARY

Aspects of the present teachings provide a substrate processing apparatus that uniformly heats a plurality of substrates stacked in a boat, by uniformly heating the interior of a processing chamber.

According to an exemplary aspect, there is provided a substrate processing apparatus including: a processing chamber; a boat (crucible) in which a plurality of substrates are stacked; an external heater located outside the processing chamber; a feeder to move the boat into and out of the processing chamber; a lower heater located below the feeder; and a central heater located at the center of the boat, between the substrates.

Additional aspects and/or advantages of the present teachings will be set forth in part in the description which follows and, in part, will be obvious from the description, or may be learned by practice of the present teachings.

BRIEF DESCRIPTION OF THE DRAWINGS

These and/or other aspects and advantages of the present teachings will become apparent and more readily appreciated from the following description of the exemplary embodiments, taken in conjunction with the accompanying drawings, of which:

FIG. 1 is a sectional view illustrating a substrate processing apparatus according to an exemplary embodiment of the present teachings.

DETAILED DESCRIPTION OF THE EXEMPLARY EMBODIMENTS

Reference will now be made in detail to the exemplary embodiments of the present teachings, examples of which are illustrated in the accompanying drawings, wherein like reference numerals refer to the like elements throughout. The exemplary embodiments are described below, in order to explain the aspects of the present teachings, by referring to the figures.

FIG. 1 is a cross-sectional view of a substrate processing apparatus 100, according to an exemplary embodiment of the present teachings. Referring to FIG. 1, the substrate processing apparatus 100 includes a boat 110 in which a plurality of substrates S are stacked, a processing chamber 120, an external heater 130, a lower heater 142, a central heater 115, and a feeder 140 to move the boat 110 into and out of the processing chamber 120.

The substrates S are generally stacked in parallel in the boat 110. The central heater 115 is located at the center of the boat 110, between the substrates S. The central heater 115 operates to uniformly heat the substrates S, in conjunction with the external heater 130, which is located outside the processing chamber 120. The central heater 115 generally applies more heat to the substrates S in the center of the boat 110 than to substrates S located at ends of the boat 110. The boat 110 may include substrate holders 112 to fix the substrates S, in order to avoid damage to the substrates when the boat 110 is moved.

Although the substrates S are shown as being vertically stacked in the boat 110, the substrates S may be horizontally stacked, according to some aspects. In either case, the long axis of the central heater 115 is generally disposed parallel to the long axes of the substrates S stacked in the boat 110.

The processing chamber 120 provides a space for simultaneously forming and/or thermally processing thin films on the substrates S stacked in the boat 110. The processing chamber 120 includes a manifold 124 having an inlet pipe 102 through which reaction gases are introduced from a reaction gas supply 200, an outlet pipe 104 through which reaction gases that have not reacted with the substrates S are discharged, and a cover 122 located on the manifold 124, to seal the processing chamber 120. A first tube 125 may be located between the cover 122 and the boat 110, in the processing chamber 120, in order to insulate the processing chamber 120 (minimize the loss of heat from the boat 110).

The bottom of the manifold 124 is opened, so that the boat 110 can be introduced and withdrawn there through. A horizontally movable shutter 160 is located on the lower side of the manifold 124, so that the processing chamber 120 can be closed after the boat 110 is introduced into the processing chamber 120. The outlet pipe 104 of the manifold 124 may be connected to a discharge pump 300, to discharge the reaction gases and to evacuate gasses from the interior of the processing chamber 120.

The heater 130 is located outside the processing chamber 120 and heats the processing chamber 120. The heater 130 may include a first heater 132 located along the side surface of the processing chamber 120, and a second heater 134 located on the top surface of the processing chamber 120. The heater 130 may be furnace-like and may surround the processing chamber 120.

The feeder 140 includes a lower heater 142, which is located adjacent to the bottom side of the boat 110. The feeder 140 may further include a thermal insulator 145 located under the lower heater 142, in order to insulate the bottom end of the processing chamber 120. The thermal insulator 145 may include a plurality of insulation plates 144 and holders 146 to support the insulation plates 144.

The substrate processing apparatus 100 may further include a second tube 170 located between the feeder 140 and the first tube 125, in order to further insulate the processing chamber 120, using the space between the feeder 140 and the first tube 125. The second tube 170 may have a length d corresponding to a region where the feeder 140 overlaps the first tube 125.

The second tube 170 is disposed around the feeder 140, and has a hole 175 that is connected to the inlet pipe 102 of the manifold 124. A gas sprayer 150 is connected to the hole 175 and sprays reaction gases supplied from the reaction gas supply 200 onto the substrates S stacked in the boat 110. The second tube 170 seals a space between the boat 110 and the first tube 125. The gas sprayer 150 preferably extends to the end of the boat 110, in order to uniformly spray the reaction gas onto the substrates S stacked in the boat 110.

In the substrate processing apparatus, the interior of the processing chamber is uniformly heated, to uniformly heat the substrates located at upper, central, and lower portions of the boat. The external heater is located outside of the processing chamber, the lower heater is located in the feeder, and the central heater is located at the center of the boat, in order to perform the uniform heating.

Therefore, a substrate processing apparatus, according to the present teachings uniformly heats the interior of a processing chamber and heats substrates located at central portions of a boat, substrates located at upper portions of the boat, and substrates located at lower portions of the boat, to a uniform temperature, thereby uniformly forming thin films on the substrates and/or thermally processing the substrates.

Although a few exemplary embodiments of the present teachings have been shown and described, it would be appreciated by those skilled in the art that changes may be made in these exemplary embodiments, without departing from the principles and spirit of the invention, the scope of which is defined in the claims and their equivalents.

What is claimed is:

1. A substrate processing apparatus, comprising:
   a processing chamber;
   a boat to house substrates;
   an external heater having a shape of a furnace and surrounding at least 3 sides of the processing chamber;
   a feeder to move the boat in and out of the processing chamber, the feeder comprising a lower heater disposed below the boat; and
   a central heater located in a center of the boat,
   wherein the external heater comprises a first heater disposed along a top surface of the processing chamber, the first heater being parallel to the top surface of the processing chamber, and
   wherein the center of the boat is substantially at a center of a height between a top and a bottom of the boat, the bottom of the boat corresponding to a side of the processing chamber that is not surrounded by the external heater.

2. The substrate processing apparatus according to claim 1, wherein long axes of the substrates and a long axis of the central heater are parallel.

3. The substrate processing apparatus according to claim 2, further comprising a thermal insulator located under the lower heater.

4. The substrate processing apparatus according to claim 3, wherein the thermal insulator comprises insulation plates and holders to support the insulation plates.

5. The substrate processing apparatus according to claim 1, wherein the processing chamber comprises a manifold comprising:
   an inlet pipe to supply a reaction gas;
   an outlet pipe through which discharge gas is pumped out of the processing chamber; and
   a cover disposed on the manifold, to enclose the processing chamber.

6. The substrate processing apparatus according to claim 5, further comprising a gas supply to supply the reaction gas to the inlet pipe.

7. The substrate processing apparatus according to claim 6, further comprising a gas sprayer connected to the inlet pipe and extending along a length of the boat, when the boat is provided in the processing chamber.

8. The substrate processing apparatus according to claim 5, further comprising a shutter located under the manifold, to open and close the processing chamber.

9. The substrate processing apparatus according to claim 5, further comprising a discharge pump connected to the outlet pipe, to pump the discharge gas through the outlet pipe.

10. The substrate processing apparatus according to claim 5, further comprising a first tube disposed between the cover and the boat.

11. The substrate processing apparatus according to claim 10, further comprising a second tube disposed around the feeder and between the feeder and the first tube.

12. The substrate processing apparatus according to claim 11, wherein the second tube comprises a length equal to an overlapped area of the first tube and the feeder.

13. The substrate processing apparatus according to claim 11, wherein the second tube comprises a hole through which the reaction gas passes.

14. A substrate processing apparatus, comprising:
   a processing chamber comprising a manifold and a cover disposed on the manifold;
   a boat to house substrates;
   an external heater having a shape of a furnace and surrounding at least 3 sides of the cover;

a feeder to move the boat in and out of the processing chamber, the feeder comprising a lower heater; and a boat heater disposed between at least two substrates at a center of the boat, wherein the external heater comprises a first heater disposed along a top surface of the processing chamber, the first heater being parallel to the top surface of the processing chamber, and wherein the center of the boat is substantially at a center of a height between a top and a bottom of the boat, the bottom of the boat corresponding to a side of the processing chamber that is not surrounded by the external heater.

15. The substrate processing apparatus according to claim 14, wherein the manifold comprises:

an inlet pipe to supply a reaction gas to the processing chamber; and an outlet pipe through which a discharge gas is pumped out of the processing chamber.

16. The substrate processing apparatus according to claim 15, further comprising:

a first tube disposed inside the cover and the manifold, to insulate the processing chamber;

a second tube disposed around the feeder and between the feeder and the first tube, the second tube having a hole connected to the inlet pipe; and a sprayer connected to the hole, to feed the reaction gas to the substrates.

17. The substrate processing apparatus according to claim 16, further comprising:

a shutter located under the manifold, to open and close the processing chamber; and a thermal insulator located under the lower heater and comprising insulation plates and holders to support the insulation plates.

18. The substrate processing apparatus according to claim 7, wherein a height of the gas sprayer is substantially equal to a height of a first tube located between the boat and a side of the processing chamber.

* * * * *